United States Patent
Takeuchi et al.

(10) Patent No.: US 9,484,466 B2
(45) Date of Patent: Nov. 1, 2016

(54) THIN FILM TRANSISTOR

(71) Applicant: Samsung Display Co., Ltd., Yongin, Gyeonggi-Do (KR)

(72) Inventors: Noboru Takeuchi, Cheonan-si (KR);
Kwi Hyun Kim, Yongin-si (KR);
Seung Soo Baek, Hwaseong-si (KR); Si Hyun Ahn, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/459,949

(22) Filed: Aug. 14, 2014

(65) Prior Publication Data

US 2015/0236161 A1  Aug. 20, 2015

(30) Foreign Application Priority Data

Feb. 17, 2014 (KR) .................. 10-2014-0018054

(51) Int. Cl.
  H01L 29/786 (2006.01)
(52) U.S. Cl.
  CPC ..... H01L 29/7869 (2013.01); H01L 29/78648 (2013.01); H01L 29/78696 (2013.01)
(58) Field of Classification Search
  CPC ........... H01L 29/7869; H01L 27/3262; H01L 27/1251
  See application file for complete search history.

(56) References Cited

U.S. PATENT DOCUMENTS

| 5,955,765 | A | 9/1999 | Yamazaki et al. | |
|---|---|---|---|---|
| 8,486,774 | B2 | 7/2013 | Terai et al. | |
| 2008/0135846 | A1* | 6/2008 | Shin et al. | 257/59 |
| 2010/0244031 | A1 | 9/2010 | Akimoto et al. | |
| 2010/0301326 | A1* | 12/2010 | Miyairi et al. | 257/43 |
| 2011/0031496 | A1* | 2/2011 | Yamazaki et al. | 257/59 |
| 2011/0089975 | A1* | 4/2011 | Yamazaki | H01L 27/1225 326/102 |
| 2011/0175674 | A1 | 7/2011 | Shimizu et al. | |
| 2011/0204368 | A1* | 8/2011 | Tsubuku et al. | 257/59 |
| 2011/0284837 | A1 | 11/2011 | Nishijima | |
| 2011/0309456 | A1* | 12/2011 | Yamazaki | H01L 29/42384 257/411 |
| 2012/0097941 | A1 | 4/2012 | Yamazaki | |

FOREIGN PATENT DOCUMENTS

| JP | 3102412 | 8/2000 |
|---|---|---|
| JP | 2000-243972 | 9/2000 |
| JP | 3239875 | 10/2001 |

(Continued)

OTHER PUBLICATIONS

Yeon Kyung Kim, et al. "A Low-Power Oxide TFT Gate Driver for High-Resolution Display" IMID 2012 Digest, pp. 272-273.

(Continued)

*Primary Examiner* — Bradley K Smith
*Assistant Examiner* — David Goodwin
(74) *Attorney, Agent, or Firm* — F. Chau & Associates, LLC

(57) ABSTRACT

A thin film transistor includes: a gate electrode; a source electrode; a drain electrode facing the source electrode; an oxide semiconductor layer disposed between the gate electrode and the source electrode or between the gate electrode and the drain electrode; and a gate insulating layer disposed between the gate electrode and the source electrode or between the gate electrode and the drain electrode, wherein when a signal applied to the gate electrode is a turnoff signal, a voltage applied to the gate electrode has a negative value.

18 Claims, 17 Drawing Sheets

(56) References Cited

FOREIGN PATENT DOCUMENTS

| JP | 2012-060091 | 3/2012 |
| JP | 2012-256838 | 12/2012 |
| JP | 2013-146066 | 7/2013 |

OTHER PUBLICATIONS

Seung-Bum Seo, et al., "Drain bias effect on the instability of amorphous indium gallium zinc oxide thin film transistor" Thin Solid Films, In Press, Corrected Proof, Available online Jan. 7, 2013, pp. 1-4.

Lu-Sheng Chou, et al., "Dual-Gate IGZO TFT for Threshold-Voltage Compensation in AMOLED Pixel Circuit" SID Symposium Digest of Technical Papers, vol. 43, Issue 1, Article first published online: Oct. 1, 2012, pp. 768-771.

K. Kaneko, et al., "Highly Reliable BEOL-Transistor with Oxygen-controlled InGaZnO and Gate/Drain Offset Design for High/Low Voltage Bridging I/O Operations" 2011 IEEE International Electron Devices Meeting, IEDM11-15, pp. 7.4.1-7.4.4.

* cited by examiner

THIN FILM TRANSISTOR

CROSS-REFERENCE TO RELATED APPLICATION

This application claims priority under 35 U.S.C. §119 to Korean Patent Application No. 10-2014-0018054 filed in the Korean intellectual Property Office on Feb. 17, 2014, the disclosure of which is incorporated by reference herein in its entirety.

1. Technical Field

The present invention relates to a thin film transistor.

2. Description of the Related Art

A flat panel display, such as a liquid crystal display (LCD), an organic light emitting diode (OLED) display, an electrophoretic display, and a plasma display, includes a pairs of field generating electrodes, with electro-optical active layers therebetween. The LCD includes a liquid crystal layer as the electo-optical active layer, and the OLED display includes an organic emission layer as the electro-optical active layer. One of the field generating electrodes is generally connected to a switching element to receive an electrical signal, and the electro-optical active layer converts the electrical signal into an optical signal to display an image.

A display panel with a thin film transistor may be included in the flat panel display. Electrodes of layers, a semiconductor, and the like are patterned on the thin film transistor array panel, and generally, a mask is used during the patterning process.

The semiconductor is a factor in determining a characteristic of the thin film transistor. In such a semiconductor, amorphous silicon may be used, but there is a limit in the manufacture of a high-performance thin film transistor with amorphous silicon due to low charge mobility. Further, in the case of using polysilicon, a high-performance thin film transistor may be easily manufactured due to its high charge mobility, but there is a limit in the manufacture of a large-sized thin film transistor array panel including polysilicon thin film transistors due to high cost and low uniformity.

Accordingly, research has been conducted for a thin film transistor using a semiconductor, which has higher electron mobility and a higher ON/OFF rate than amorphous silicon, and has lower cost and higher uniformity than polysilicon.

SUMMARY

A thin film transistor according to an exemplary embodiment of the present invention includes: a gate electrode; a source electrode; a drain electrode facing the source electrode; an oxide semiconductor layer disposed between the gate electrode and the source electrode or between the gate electrode and the drain electrode; and a gate insulating layer disposed between the gate electrode and the source electrode or between the gate electrode and the drain electrode, wherein when a signal applied to the gate electrode is a turn-off signal, a voltage applied to the gate electrode has a negative value.

The thin film transistor may be included in a gate driver of a display device.

The thin film transistor may be directly connected with an output terminal of the gate driver, and the output terminal may be connected with a gate line and outputs a gate signal.

The negative value may be between about −20 V and about −3 V.

The oxide semiconductor layer may include indium gallium zinc oxide.

The oxide semiconductor layer and the gate electrode may be disposed on each other.

The thin film transistor may further include an etching protection layer disposed on the oxide semiconductor layer and covering a channel area of the oxide semiconductor layer.

The gate electrode may be wider than a channel area of the oxide semiconductor layer, A thickness of the gate insulating layer may be uniform in a portion of the gate insulating layer corresponding to the channel area.

The thin film transistor may further include a floating metal layer disposed between the source electrode and the drain electrode.

The floating metal layer may be electrically floated.

The floating metal layer may overlap a channel area of the oxide semiconductor layer.

The floating metal layer may be disposed on a same layer as the source electrode and the drain electrode.

The floating metal layer may have an island shape.

The thin film transistor may further include an etching protection layer disposed between the floating metal layer and the oxide semiconductor layer.

When the gate electrode is applied with a negative voltage to turn off the thin film transistor, there may be no conduction between the source electrode and the drain electrode.

DETAILED DESCRIPTION OF THE EMBODIMENTS

Figure 1:
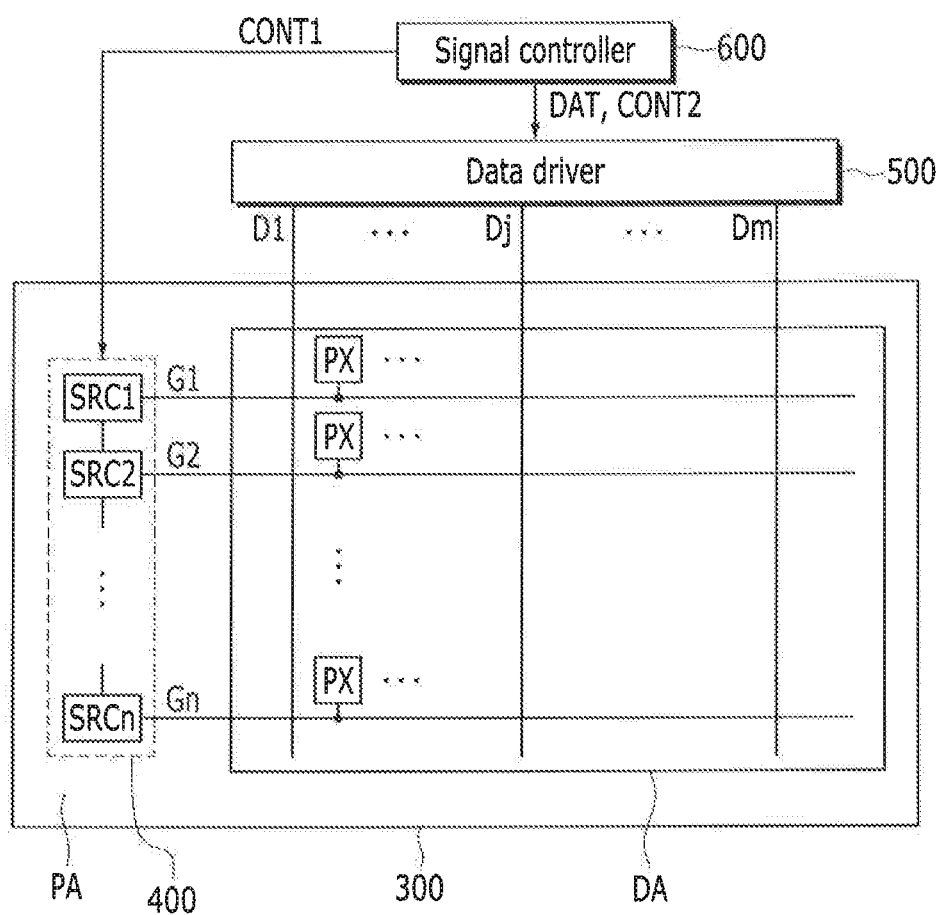
FIG. 1 is a block diagram of a display device according to an exemplary embodiment of the present invention.

Exemplary embodiments of the present invention will be described more fully hereinafter with reference to the accompanying drawings. However, the described embodiments may be modified in various different ways and should not be construed as limited to the embodiments disclosed herein.

In the drawings, the thickness of layers, films, panels, regions, substrates, etc., may exaggerated for clarity. It will be understood that when an element such as a layer, film, panel, region or substrate is referred to as being "on" another element, it can be directly on the other element or intervening elements may also be present. Like reference numerals may designate like elements throughout the specification.

Figure 2:
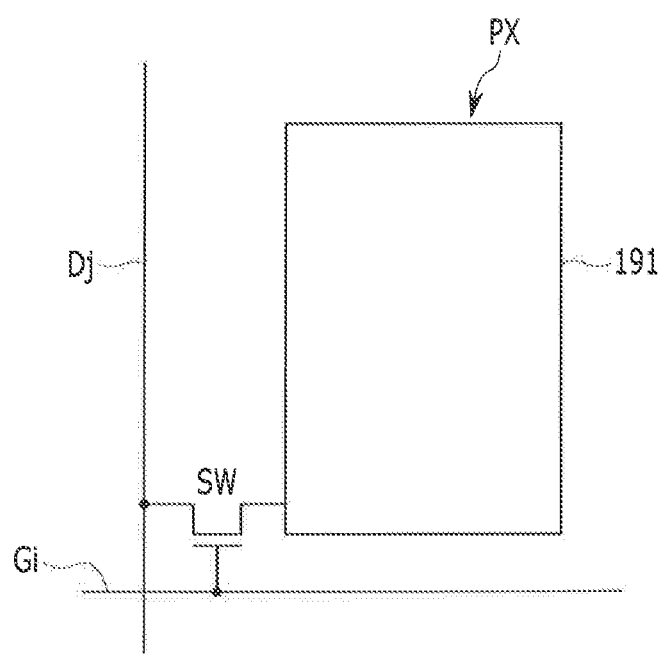
FIG. 2 is a circuit diagram of a pixel of the display device of FIG. 1 according to an exemplary embodiment of the present invention.

FIG. 1 is a block diagram of a display device according to an exemplary embodiment of the present invention. FIG. 2 is a circuit diagram of a pixel of the display device of FIG. 1 according to an exemplary embodiment of the present invention.

Referring to FIG. 1, the display device includes a display panel 300, a gate driver 400, a data driver 500, and a signal controller 600.

The display panel 300 may be a display panel included in various display devices such as a liquid crystal display (LCD), an organic light emitting diode (OLED) display, an electro-wetting display (EWD), and the like.

The display panel 300 includes a display area DA for displaying an image and a peripheral area (PA) provided at the periphery of the display area DA.

In the LCD, the display area DA includes a thin film transistor, a LC capacitor, and a storage capacitor. In the OLED display, the display area DA includes a thin film transistor and an OLED, and in other display panels, the display area DA is formed to include elements such as a thin film transistor and the like. Hereinafter, the display device will be exemplarily described as a LC panel, but the present invention is not limited thereto.

A plurality of gate lines G1 to Gn, a plurality of data lines D1 to Dm, and a plurality of pixels PX connected to the plurality of gate lines G1 to Gn and the plurality of data lines D1 to Dm are provided in the display area DA.

The gate lines G1 to Gn transmit a gate signal and may be almost parallel with each other substantially in a row direction.

The data lines D1 to Dm transmit a data voltage corresponding to an image signal, and may be almost parallel with each other substantially in a column direction.

The plurality of pixels PX may be arranged substantially in a matrix format.

Referring to FIG. 2, each pixel PX may include at least one switching element SW connected to a gate line Gi and a data line Dj, and at least one pixel electrode 191 connected to the switching element SW. The switching element SW may be a three terminal element such as a thin film transistor integrated with the display panel 300. The thin film transistor includes a gate terminal, an input terminal, and an output terminal. The switching element SW may transmit a data signal from the data line T to the pixel electrode 191 by being turned on or turned off according to a gate signal of the gate line Gi. The switching element SW may include at least one thin film transistor. The pixel PX may display a corresponding image according to a data voltage applied to the pixel electrode 191.

Referring to FIG. 1, the peripheral area PA is a part of a non-display area where an image is not displayed in the display device, and may be covered by a light blocking member. The peripheral area PA may surround the display area DA or may be located at the edge of the display panel 300.

The gate driver 400 and a plurality of signal wires for transmitting a driving signal to the gate driver 400 may be provided in the peripheral area PA. The gate lines G1 to Gn and the data lines D1 to Dm of the display area DA may be extended to the peripheral area PA. The signal controller 600 controls drivers such as the data driver 500 and the gate driver 400.

The signal controller 600 receives an input image signal and an input control signal for controlling the display of the input image signal from an external graphics controller (not shown). The input control signal includes, for example, a vertical synchronization signal, a horizontal synchronization signal, a main clock signal, a data enable signal, and the like. The signal controller 600 processes the input image signal based on the input image signal and the input control signal to convert the input image signal to a digital image signal DAT, and generates a gate control signal CONT1 and a data control signal CONT2. The gate control signal CONT1 includes a scan start signal for instructing the start of scanning, at least one clock signal for controlling an output period of a gate-on voltage, at least one low voltage, and the like. The data control signal CONT2 includes a horizontal synchronization start signal for informing transmission start of the digital image signal DAT for pixels PX in one row, a load signal, a data clock signal, and the like.

The signal controller 600 may transmit the data control signal CONT2, the gate control signal CONT1, and the digital image signal DAT to the gate driver 400 and the data driver 500.

The data driver 500 is connected with the data lines D1 to Dm of the display panel 300. The data driver 500 receives the data control signal CONT2 and the digital image signal DAT from the signal controller 600, selects a gray voltage corresponding to each digital image signal DAT to convert the digital image signal DAT to an analog data signal, and then applies the analog data signal to the corresponding data lines D1 to Dm.

The data driver 500 may be mounted to the peripheral area PA of the display panel 300 in the form of a plurality of driving chips, may be mounted on a flexible printed circuit film and then attached to the display device in the form of a tape carrier package (TCP), or may be mounted on a printed circuit board. According to an exemplary embodiment of the present invention, the data driver 500 may be integrated in the peripheral area PA of the display panel 300 together with an electric element such as a thin film transistor of the display area DA through the same process.

The gate driver 400 is connected with the gate lines G1 to Gn. The gate driver 400 generates a gate signal including a gate-on voltage and a gate-off voltage according to the gate control signal CONT1 provided from the signal controller 600, and applies the gate signal to the gate lines G1 to Gn. The gate-on voltage is a voltage applied to a gate terminal of a thin film transistor of the display area DA to turn on the thin film transistor, and the gate-off voltage is a voltage applied to the gate terminal of the thin film transistor to turn off the thin film transistor.

Referring to FIG. 1, the gate driver 400 is integrated with the peripheral area PA of the display panel 300. The gate driver 400 may include a plurality of stages SRC1 to SRCn dependently connected to each other and sequentially arranged.

The plurality of stages SRC1 to SRCn generate gate signals to sequentially transfer the gate signals to the gate lines G1-Gn. Each of the stages SRC1 to SRCn includes a gate driving circuit connected to each of the gate lines G1 to Gn, and may include a gate output terminal (not shown) for outputting a gate signal.

The stages SRC1 to SRCn of the gate driver 400 may be provided in the left or right side peripheral area PA of the display area DA, and are arranged in a row along a column direction. FIG. 1 exemplarily illustrates that the plurality of stages SRC1 to SRCn are provided in the left side peripheral area PA of the display area DA, but this is not restrictive. The plurality of stages SRC1 to SRCn may also be provided at the right, top, and bottom side peripheral area PA of the display area DA.

According to an exemplary embodiment of the present invention, each of the stages SRC1 to SRCn may be connected with an output terminal of the previous stage or the next stage. Since no previous stage is provided for the first stage SRC1, the first stage SRC1 can receive a scan start signal STV that informs the start of one frame. The last stage SRCn having no next stage can receive another signal rather than being connected to an output terminal of the next stage.

Figure 3:
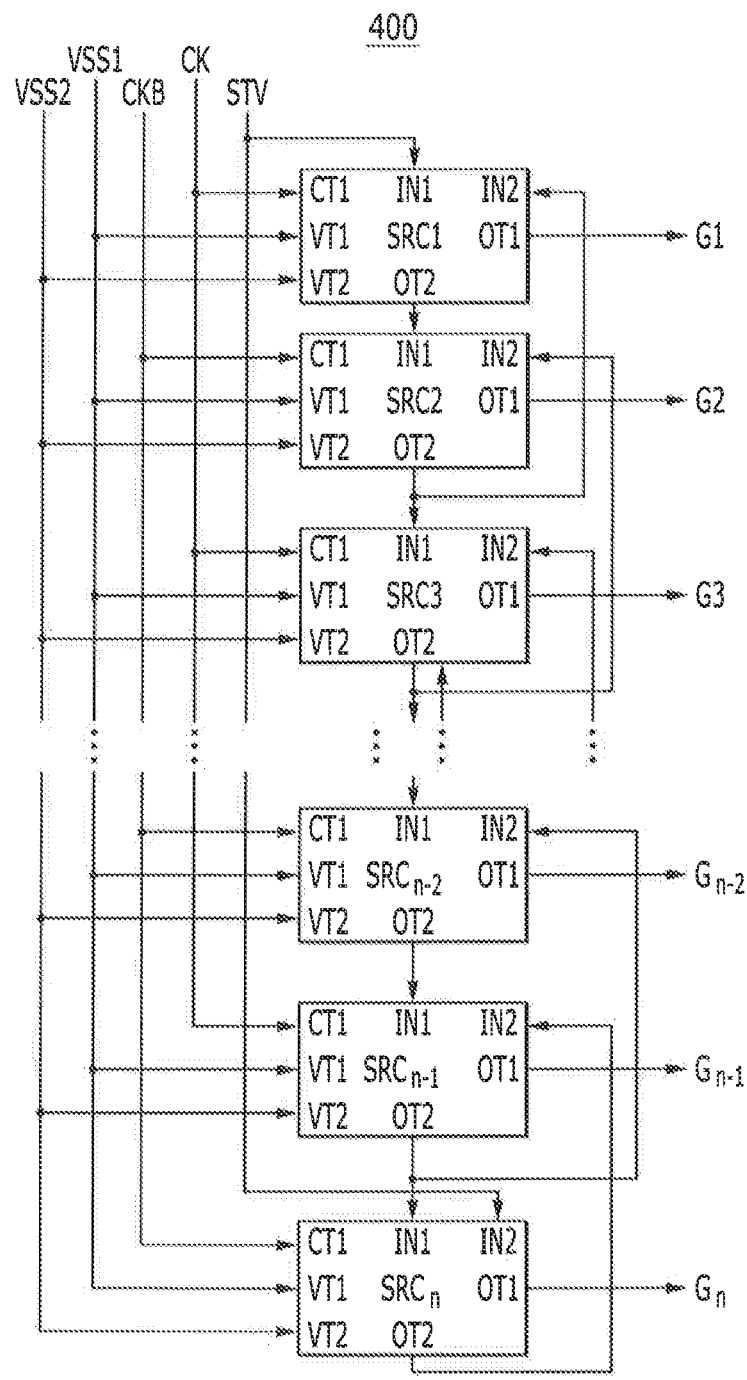
FIG. 3 is a block diagram of a gate driver of the display device of FIG. 1 according to an exemplary embodiment of the present invention.

FIG. 3 is a block diagram of the gate driver 400 of the display device of FIG. 1 according to an exemplary embodiment of the present invention.

The gate driver 400 of the display device of FIG. 1 includes shift registers respectively including the first to n-th stages SRC1 to SRCn that are dependently connected to each other.

The first to n-th stages SRC1 to SRCn are respectively connected with n gate lines and sequentially output n gate signals.

Each stage includes a first clock terminal CT1, a first input terminal IN1, a second input terminal IN2, a first voltage terminal VT1, a second voltage terminal VT2, a first output terminal OT1, and a second output terminal OT2.

The first clock terminal CT1 receives a clock signal CK or an inverse clock signal CKB of which the phase of the clock signal CK is inverted. For example, first clock terminals CT1 of odd-numbered stages SRC1, SRC3, . . . , SRC(n–1) receive the clock signal CK, and first clock terminals CT1 of even-numbered stages SRC2, SRC4, . . . , SRCn receive the inverse clock signal CKB. The clock signal CK and the inverse clock signal CKB may be formed of a high voltage VDD and a first low voltage VSS1.

The first input terminal IN1 receives a vertical start signal STV or a (n–1)-th carry signal. For example, the first input terminal IN1 of the first stage SRC1 receives the vertical start signal STV, and the first input terminals IN1 of the second stage SRC2 to the n-th stage SRCn respectively receive the (n–1)-th carry signal.

The second input terminal IN2 receives a (n+1)-th carry signal or the vertical start signal STV. For example, the second input terminals IN2 of the first to (n–1)-th stages SRC1 to SRC(n–1) respectively receive the (n+1)-th carry signal, and the second input terminal of the n-th stage SRCn receives the vertical start signal STV. The vertical start signal STV received at the second input terminal IN2 of the n-th stage SRCn may be a vertical start signal corresponding to the next frame.

The first voltage terminal VT1 receives the first low voltage VSS1. The first low voltage VSS1 has a first low level that corresponds to a discharge level of the gate signal. For example, the first low level may be about –6 V.

The second voltage terminal VT2 receives a second low voltage VSS2 having a second low level that is lower than the first low level. The second low level corresponds to a discharge level of a first node included in each stage. For example, the second low level may be about –10 V.

The first output terminal OT1 is electrically connected with the corresponding gate line and outputs a gate signal. The first output terminals OT1 of the first to n-th stages SRC1 to SRCn respectively output first to n-th gate signals. For example, the first output terminal OT1 of the first stage SRC1 is electrically connected with the first gate line and outputs a first gate signal G1, and the first output terminal OT1 of the second stage SRC2 is electrically connected with the second gate line and outputs a second gate signal G2. The first gate signal G1 is output first and then the second gate signal G2 is output. Then, the third gate signal G3 to the n-th gate signal Gn are sequentially output.

The second output terminal OT2 outputs a carry signal. The second output terminal OT2 of the (n–1)-th stage SRC(n–1) is electrically connected with the first input terminal IN1 of the n-th stage SRCn. In addition, the second output terminal OT2 of the n-th stage SRCn is electrically connected with the second input terminal IN2 of the (n–1)-th stage SRC(n–1).

Figure 4:
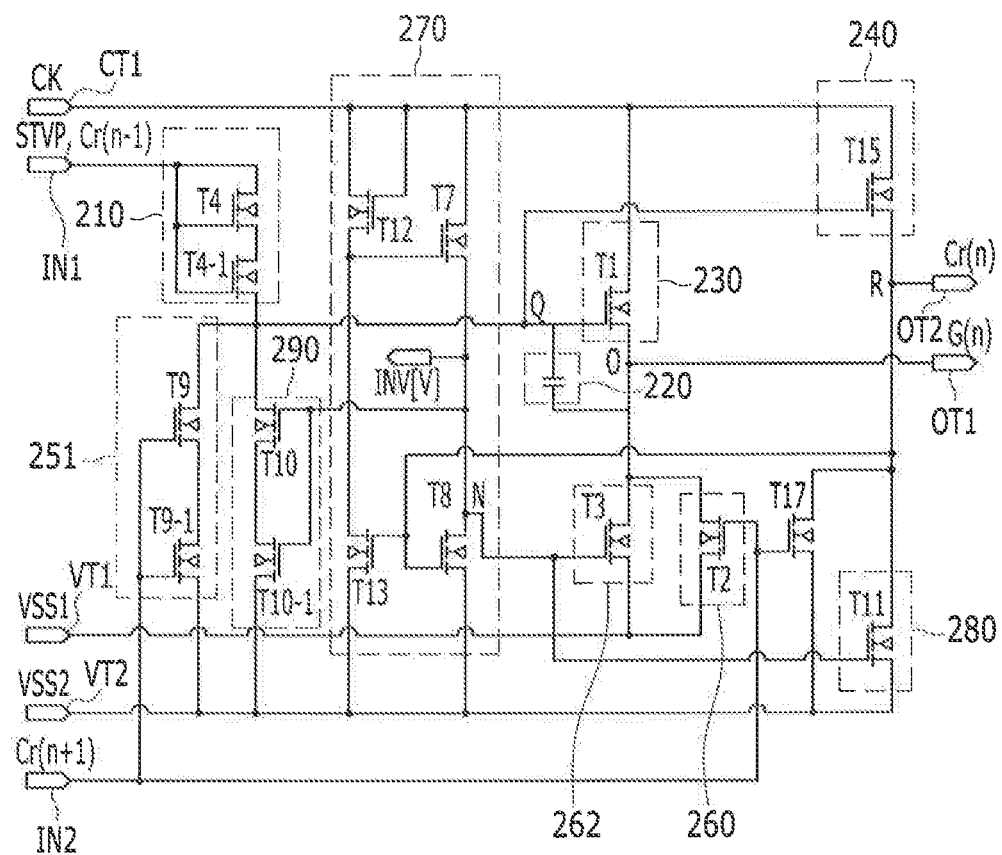
FIG. 4 is a circuit diagram of a stage of the gate driver of the display device of FIG. 1 according to an exemplary embodiment of the present invention.

FIG. 4 is a circuit diagram of a stage of the gate driver 400 of the display device of FIG. 1 according to an exemplary embodiment of the present invention. For example, FIG. 4 shows the n-th stage SRCn of the gate driver 400.

The n-th stage SRCn of the gate driver 400 includes a buffer unit 210, a charging unit 220, a pull-up unit 230, a pull-down unit 260, an output node holding unit 262, a carry unit 240, a third contact holding unit 280, an inverter 270, a discharge unit 251, and a first node holding unit 290.

The buffer unit 210 transmits a first (n–1)-th carry signal Cr(n–1) to the pull-up unit 230. The buffer unit 210 may include a fourth transistor T4. The fourth transistor T4 includes a control terminal and an input terminal that are connected to the first input terminal IN1 and an output terminal connected to the first node Q.

In addition, the buffer unit 210 may further include a fourth additional transistor T4-1. The fourth additional transistor T4-1 may include a control terminal connected to the first input terminal IN1, an input terminal connected to the fourth transistor T4, and an output terminal connected to the first node Q. In this case, an output terminal of the fourth transistor T4 may be connected to the input terminal of the fourth additional transistor T4-1 instead of being connected to the first node Q. The fourth additional transistor T4-1 may be omitted.

The charging unit 220 is charged responding to the (n–1)-th carry signal Cr(n–1) supplied from the buffer unit 210. A first end of the charging unit 220 is connected with the first node Q and a second end is connected to an output node O of the gate signal. When the high voltage VDD of the (n–1)-th carry signal Cr(n–1) is received by the buffer unit 210, the charging unit 220 charges a first voltage V1 corresponding to the high voltage VDD.

The pull-up unit 230 outputs the gate signal. The pull-up unit 230 may include a first transistor T1, The first transistor T1 includes a control terminal connected to the first node Q, an input terminal connected with a first clock terminal CT1, and an output terminal connected to the output node O. The output node O is connected to the first output terminal OT1.

When the high voltage VDD of the clock signal CK is received at the first clock terminal CT1 while the first voltage V1 charged by the charging unit 220 is applied to the control terminal of the pull-up unit 230, the pull-up unit 230 is bootstrapped. In this case, the first node Q connected with the control terminal of the pull-up unit 230 is boosted to a boosting voltage VBT from the first voltage V1. In other words, the first node Q is increased to the first voltage V1 and then increased again to the boosting voltage VBT.

While the boosting voltage VBT is applied to the control terminal of the pull-up unit 230, the pull-up unit 230 outputs the high voltage VDD of the clock signal CK as a high voltage VDD of the n-th gate signal G(n). The n-th gate signal G(n) is output though the first output terminal OT1 connected to the output node O.

The pull-down unit 260 pulls down the n-th gate signal G(n). The pull-down unit 260 may include a second transistor T2. The second transistor T2 includes a control terminal connected to the second input terminal IN2, an input terminal connected to the output node O, and an output terminal connected to the first voltage terminal VT1. When the (n+1)-th carry signal Cr(n+1) is received at the second input terminal IN2, the pull-down unit 260 pulls down a voltage of the output node O to a first low voltage VSS1 applied to the first voltage terminal VT1.

The output node holding unit 262 maintains a voltage of the output node O. The output node holding unit 262 may include a third transistor T3. The third transistor T3 includes a control electrode connected to a second node N, an input electrode connected to the output node O, and an output electrode connected to the first voltage terminal VT1. The output node holding unit 262 maintains a voltage of the output node O with the first low voltage VSS1 applied to the first voltage terminal VT1 responding to a signal of the second node N.

The voltage of the output node O, pulled down to the first low voltage VSS1, can be more stably maintained by the output node holding unit 262, and the output node holding unit 262 can be omitted.

The carry unit 240 outputs the carry signal Cr(n). The carry unit 240 may include a fifteenth transistor T15. The fifteenth transistor T15 includes a control terminal connected to the first node Q, an input terminal connected to the first clock terminal CT1, and an output terminal connected to a third node R. The third node R is connected to the second output terminal OT2.

The carry unit 240 may further include a capacitor for connecting the control terminal and the output terminal of the fifteenth transistor T15. When a high voltage is applied to the first node Q, the carry unit 240 outputs a high voltage VDD of the clock signal CK received at the first clock terminal CT1 as the n-th carry signal Cr(n). The n-th carry signal Cr(n) is output through the second output terminal OT2 connected to the third node R.

The third contact holding unit 280 maintains a voltage of the third node R The third contact holding unit 280 may include an eleventh transistor T11. The eleventh transistor T11 includes a control terminal connected to the second node N, an input terminal connected to the third node R, and an output terminal connected to the second voltage terminal VT2. The third contact holding unit 280 maintains a voltage of the third node R with a second low voltage VSS2 responding to a signal of the second node N.

The inverter 270 applies a signal of which a phase is the same as that of the clock signal CK received at the first clock terminal CT1 to the second node N during periods other than an output period of the nth carry signal Cr(n). The inverter 270 may include a twelfth transistor T12, a seventh transistor T7, a thirteenth transistor T13, and an eighth transistor T8.

The twelfth transistor 112 includes a control terminal and an input terminal connected to the first clock terminal CT1, and an output terminal connected to an input terminal of the thirteenth transistor 113 and control terminal of the seventh transistor 17. The seventh transistor T7 includes the control terminal connected to the thirteenth transistor T13, an input terminal connected to the first clock terminal CT1, and an output terminal connected with the input terminal of the eighth transistor 18. The output terminal of the seventh transistor T7 is connected to the second node N.

The thirteenth transistor T13 includes a control terminal connected to the third node R, an input terminal connected with the twelfth transistor T12, and an output terminal connected to the second voltage terminal VT2. The eighth transistor T8 includes a control terminal connected to the third node R, an input terminal connected to the second node N, and an output terminal connected to the second voltage terminal VT2.

The inverter 270 discharges the clock signal CK received at the first clock terminal CT1 with the second low voltage VSS2 applied to the second voltage terminal VT2 while a high voltage is applied to the third node R. In other words, the eighth transistor 18 and the thirteenth transistor 113 are turned on in response to the high voltage of the third node R, and accordingly the clock signal OK is discharged to the second low voltage VSS2. Thus, the second node N, which is an output node of the inverter 270, is maintained with the second low voltage VSS2 while the n-th gate signal G(n) is output The discharge unit 251 discharges the high voltage of the first node Q to the second low voltage VSS2 that is lower than the first low voltage VSS1 in response to the (n+1)-th carry signal Cr(n+1). The discharge unit 251 may include a ninth transistor T9. The ninth transistor T9 includes a control terminal connected to the second input terminal IN2, an input terminal connected to the first node Q, and an output terminal connected to the second voltage terminal VT2.

In addition, the discharge unit 251 may further include a ninth additional transistor T9-1. The ninth additional transistor T9-1 may include a control terminal connected to the second input terminal IN2, an input terminal connected to the ninth transistor T9, and an output terminal connected to the second voltage terminal VT2. In this case, the output terminal of the ninth transistor T9 may be connected to the input terminal of the ninth additional transistor T9-1, instead of being connected to the second voltage terminal VT2.

When the (n+1)-th carry signal Cr(n+1) is applied to the second input terminal IN2, the discharge unit 251 discharges the voltage of the first node Q to the second low voltage VSS2 applied to the second voltage terminal VT2.

Therefore, the voltage of the first node Q is increased to the boosting voltage VBT from the first voltage V1 and then decreased to the second low voltage VSS2.

Although it is described that the output terminal of the ninth transistor T9 is connected to the second voltage terminal VT2, this is not restrictive. The output terminal of the ninth transistor T9 may be connected to the first voltage terminal VT1.

The first node holding unit 290 maintains the voltage of the first node Q. The first node holding unit 290 may include a tenth transistor T10. The tenth transistor T10 includes a control terminal connected to the second node N, an input terminal connected to the first node Q, and an output terminal connected to the second voltage terminal VT2.

The first node holding unit 290 may further include a tenth additional transistor T10-1. The tenth additional transistor T10-1 includes a control terminal connected to the second node N, an input terminal connected to the tenth transistor T10, and an output terminal connected to the second voltage terminal VT2. In this case, the output terminal of the tenth transistor T10 may be connected to the input terminal of the tenth additional transistor T10-1.

The first node holding unit 290 maintains the voltage of the first node Q with the second low voltage VSS2 in response to a signal of the second node N.

Hereinafter, a driving characteristic of a thin film transistor according to the exemplary embodiment of the present invention will be described with reference to FIG. 5 and FIG. 6.

Figure 5:
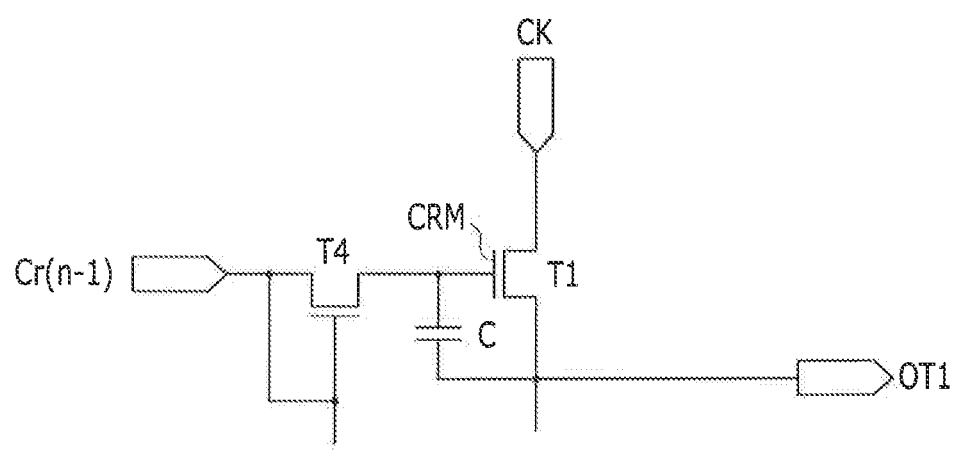
FIG. 5 is a circuit diagram illustrating a first transistor and a fourth transistor connected to a first node in the circuit diagram of FIG. 4.

FIG. 5 is a circuit diagram illustrating the first transistor T1 and the fourth transistor T4 connected to the first node Q in the circuit diagram of FIG. 4. FIG. 6 is a graph illustrating a control signal, an input signal, and an output signal in the thin film transistor of FIG. 5.

In FIG. 5, the fourth additional transistor T4-1 shown in the circuit diagram of FIG. 4 is omitted. Thus, the output terminal of the fourth transistor T4 is connected to the first node Q.

Referring to FIG. 5, the first transistor T1 is directly connected with the first output terminal OT1. The first output terminal OT1 is a terminal connected with a corresponding gate line G1 to Gn and for outputting a gate signal. Thus, a turn-on voltage of the first transistor T1 is output by a higher driving capability compared to other transistors of the gate driver 300, and therefore should have high reliability.

A control terminal CRM of the first transistor T1 receives the carry signal Cr(n−1). The thin film transistor according to an exemplary embodiment of the present invention, which may be embodied as the first transistor T1, maintains a negative voltage except when the carry signal. Cr(n−1) becomes the turn-on signal for charging a capacitor C, thereby preventing deterioration of the first transistor T1. In other words, when a signal applied to the control terminal CRM of the first transistor T1 is a turn-off signal, a voltage applied to the control terminal CRM may have a negative value. In the present exemplary embodiment, the negative voltage may be a voltage of greater than about −20 V and less than about −3 V. For example, the negative voltage may be −5 V in the present exemplary embodiment.

Figure 6:
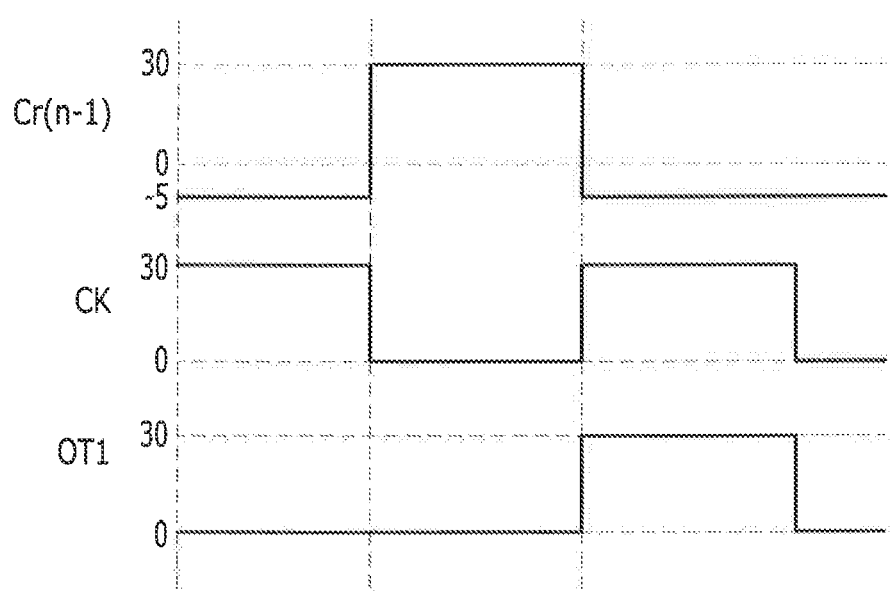
FIG. 6 is a graph illustrating a control signal, an input signal, and an output signal in the thin film transistor of FIG. 5.

Referring to FIG. 6, the carry signal Cr(n−1) is applied as a turn-on signal of 30 V and thus the capacitor C is charged, and the first transistor T1 outputs the gate signal. According to the present exemplary embodiment, the carry signal Cr(n−1) maintains the negative voltage of −5 V except when the carry signal Cr(n−1) is the turn-on signal. When the carry signal Cr(n−1) is a turn-off signal, the clock signal CK is transmitted to the input terminal of the first transistor T1 and thus a current leakage may occur, but according to the present exemplary embodiment, the negative voltage is applied to the control terminal of the first transistor T1 thus cutting off of the first transistor T1, thereby preventing generation of accelerated electrons due to the leakage current. For example, the accelerated electrons experience grid collision with high kinetic energy at the periphery of an electrode that corresponds to the input terminal such that an electrical characteristic of the thin film transistor can be changed.

In the above-stated description, the thin film transistor included in the gate driver is exemplarily illustrated, but this is not restrictive. A switching element formed in a self-emissive organic light emitting device, an electronic paper that can be formed at a low temperature, or a plastic substrate such as a flexible display device is applicable.

Figure 7:
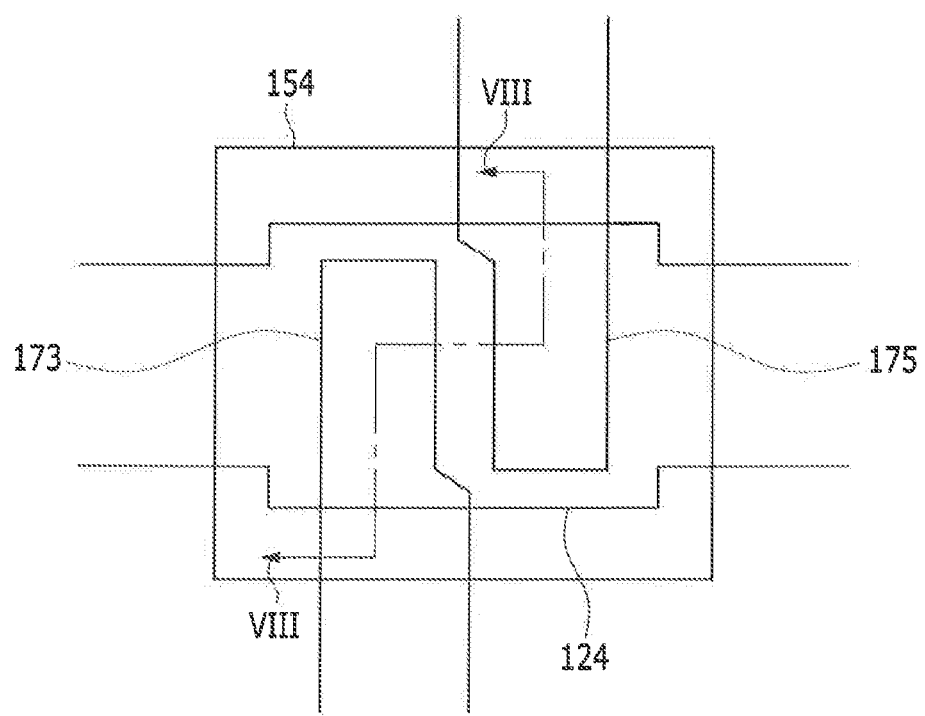
FIG. 7 is a top plan view of a thin film transistor according to an exemplary embodiment of the present invention.
Figure 8:
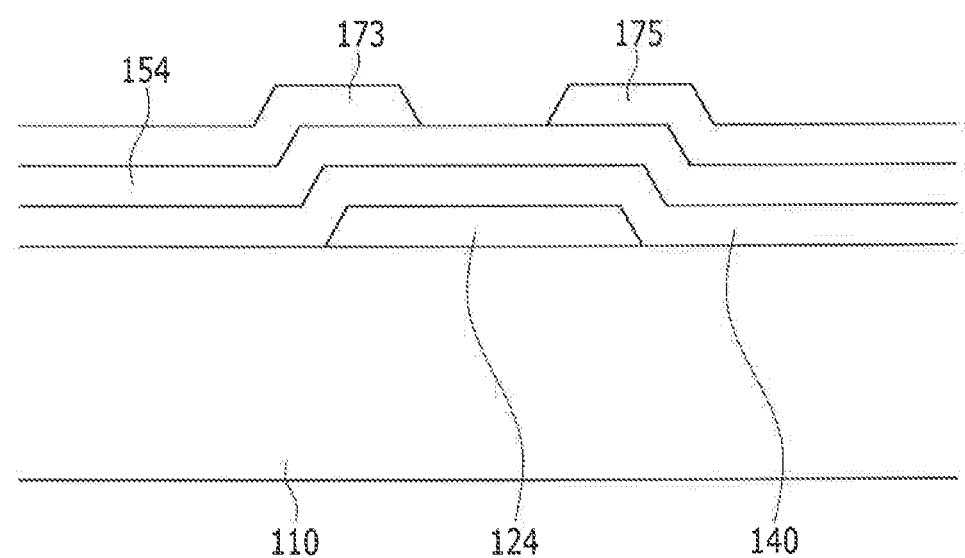
FIG. 8 is a cross-sectional view of FIG. 7, taken along line

FIG. 7 is a top plan view of a thin film transistor according to an exemplary embodiment of the present invention. FIG. 8 is a cross-sectional view of FIG. 7, taken along line VIII-VIII.

Referring to FIG. 7 and FIG. 8, a gate electrode 124 is provided on a first substrate 110. The substrate 110 may be an insulation substrate, and may include plastic or glass and the like.

The gate electrode 124 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). Alternatively, the gate electrode 124 may include a transparent conductive material such as indium tin oxide (ITO), indium zinc oxide (IZO), aluminum doped ZnO (AZO), and the like. Or, the gate electrode 124 may have a multilayer structure which includes at least two conductive layers (not illustrated).

A gate insulating layer 140 is provided on the gate electrode 124. The gate insulating layer 140 may include a silicon nitride (SiNx), a silicon oxide (SiOx), a silicon oxynitride (SiON), an organic insulating material, and the like. The gate insulating layer 140 may have a multilayer structure which includes at least two insulation layers (not illustrated). For example, an upper layer portion of the gate insulating film 140 may be made of a SiOx and a lower layer portion of the gate insulating film 140 may be made of a SiNx. Alternatively the upper layer portion of the gate insulating film 140 may be made of a SiOx and the lower layer portion of the gate insulating film 140 may be made of a SiON. In a case in which the gate insulating film 140, which is in contact with an oxide semiconductor layer 154, includes an oxide, deterioration of a channel layer may be prevented.

An oxide semiconductor layer 154 is provided on the gate insulating layer 140.

The oxide semiconductor layer 154 may be made of an oxide including at least one of indium (In), gallium (Ga), zinc (Zn), and tin (Sn). For example, in the present exemplary embodiment, the oxide semiconductor layer 154 may include IGZO.

A source electrode 173 and a drain electrode 175 are provided facing each other on the oxide semiconductor layer 154. The source electrode 173 may be an input terminal of the thin film transistor, and the drain electrode 175 may be an output terminal of the thin film transistor. The source electrode 173 and the drain electrode 175 may be made of one selected from an aluminum-based metal such as aluminum (Al) and an aluminum alloy, a sliver-based metal such as silver (Ag) and a silver alloy, and a copper-based metal such as copper (Cu) and a copper alloy.

In the present exemplary embodiment, the source electrode 173 and the drain electrode 175 are respectively provided as a single layer, but they may be made in the form of a dual layer or a triple layer.

In the present exemplary embodiment, the source electrode 173 and the drain electrode 175 are extended in parallel with each other, and may be formed in the shape of a bar.

A portion of the oxide semiconductor layer 154 not covered by the source electrode 173 and the drain electrode 175 between the source electrode 173 and the drain electrode 175 may form a channel area. The gate insulating layer 140 corresponding to the channel area may have a uniform thickness in the present exemplary embodiment. In addition, the gate electrode 124 may have a wider width than the channel area of the oxide semiconductor layer 154.

Although it is not illustrated, a passivation layer may be provided to cover the source electrode 173, the drain electrode 175, and the channel area of the oxide semiconductor layer 154.

Figure 9:
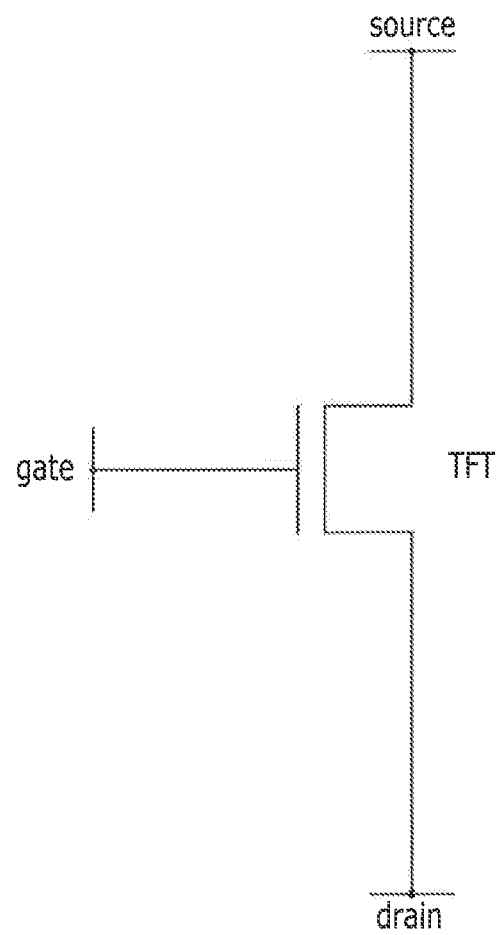
FIG. 9 is a circuit diagram of the thin film transistor of FIG. 8.
Figure 10:
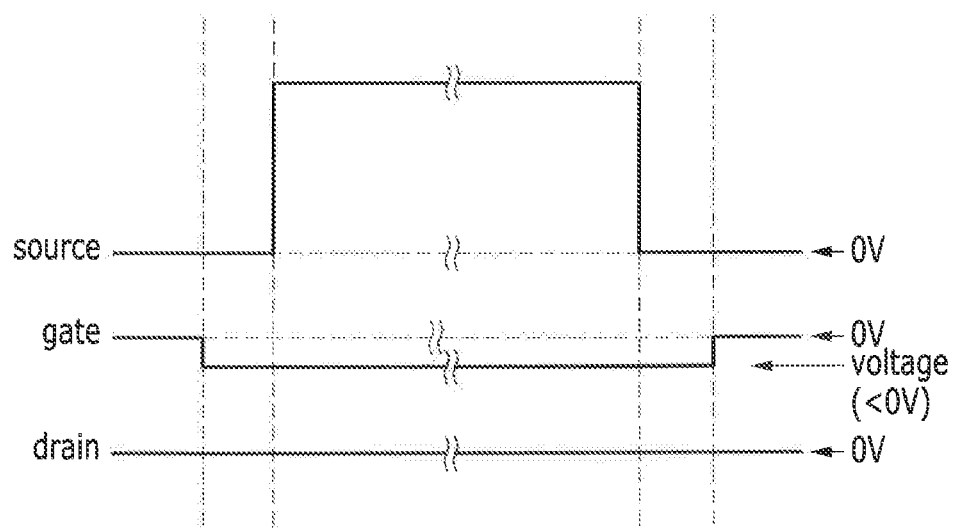
FIG. 10 is a graph illustrating a control signal, an input signal, and an output signal in the thin film transistor of FIG. 8 and FIG. 9.

FIG. 9 is a circuit diagram of the thin film transistor of FIG. 8. FIG. 10 is a graph illustrating a control signal, an input signal, and an output signal in the thin film transistor of FIG. 8 and FIG. 9.

Referring to FIG. 9 and FIG. 10, the gate electrode may correspond to a control terminal of the thin film transistor TFT, the source electrode may correspond to an input terminal of the thin film transistor TFT, and the drain electrode may correspond to an output terminal of the thin film transistor TFT. In the present exemplary embodiment, the oxide semiconductor forming the channel area includes a lot of donors derived from oxygen vacancy so that a threshold voltage Vth is low. Due to the low threshold voltage Vth, a leakage current may flow between the source electrode and the drain electrode even though a voltage of the gate voltage is 0 V. In this case, as shown in FIG. 10, electrons forming the leakage current are accelerated while a voltage is being applied to the source electrode and thus the electrons experience grid collision with high kinetic energy at the periphery of the source electrode, thereby changing an electrical characteristic of the thin film transistor TFT. However, as shown in FIG. 10, a negative voltage is applied to the gate electrode and thus the gate electrode is cut off, thereby preventing accelerated electrons from being generated in the present exemplary embodiment.

Figure 11:
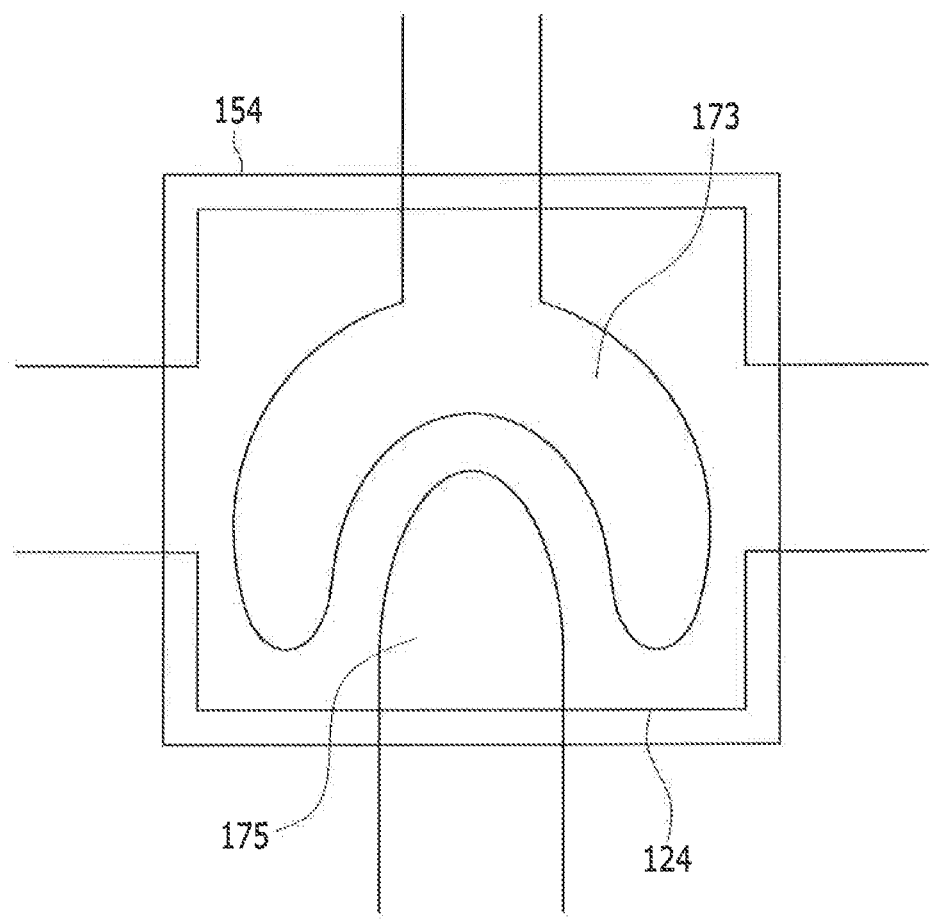
FIG. 11 is a top plan view of a thin film transistor according to an exemplary embodiment of the present invention.

FIG. 11 is a top plan view of a thin film transistor according to an exemplary embodiment of the present invention.

The exemplary embodiment of FIG. 11 is almost the same as the exemplary embodiment described with reference to FIG. 7 to FIG. 10. Therefore, only a different portion will now be described.

Referring to FIG. 11, a source electrode 173 of the thin film transistor may have a U-shape, and a drain electrode 175 may be extended downward from the center of the U-shaped source electrode 173. The shapes of the source electrode 173 and the drain electrode 175 are exemplarily described, and may be variously changed. Except for the difference, the contents described with reference to FIG. 7 to FIG. 10 can be applied to the present exemplary embodiment.

Figure 12:
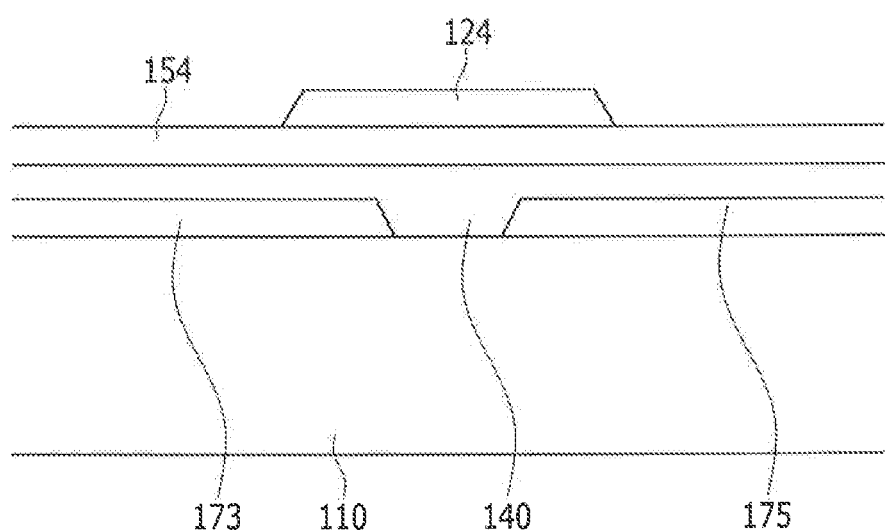
FIG. 12 is a cross-sectional view of a thin film transistor according to an exemplary embodiment of the present invention.

FIG. 12 is a cross-sectional view of a thin film transistor according to an exemplary embodiment of the present invention.

The exemplary embodiment of FIG. 12 is almost the same as the exemplary embodiment described with reference to FIG. 7 to FIG. 10. Therefore, only a different portion will now be described.

Referring to FIG. 12, in the thin film transistor according to the present exemplary embodiment, a gate electrode 124 is provided on an oxide semiconductor 154, and a source electrode 173 and a drain electrode 175 are provided below the oxide semiconductor 154. Except for the difference, the contents described with reference to FIG. 7 to FIG. 10 can be applied to the present exemplary embodiment.

Figure 13:
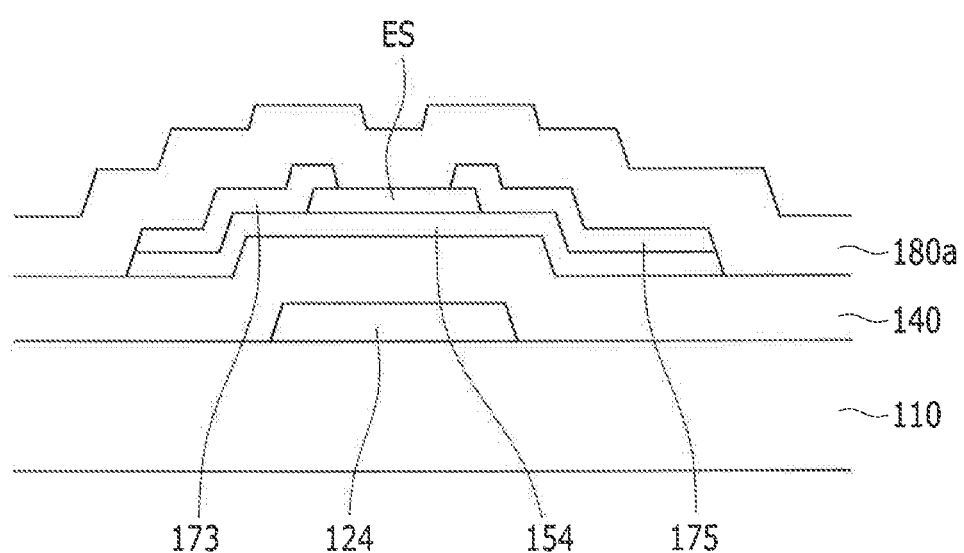
FIG. 13 is a cross-sectional view of a thin film transistor according to an exemplary embodiment of the present invention.

FIG. 13 is a cross-sectional view of a thin film transistor according to an exemplary embodiment of the present invention.

The exemplary embodiment of FIG. 13 is almost the same as the exemplary embodiment described with reference to FIG. 7 to FIG. 10. Therefore, only a different portion will now be described.

Referring to FIG. 13, an etching preventing layer ES is provided in a location corresponding to a channel area of an oxide semiconductor layer 154. A source electrode 173 and a drain electrode 175 of the thin film transistor are respectively provided on the oxide semiconductor layer 154 to overlap lateral edges of the etching protection layer ES. The etching protection layer ES protects the oxide semiconductor layer 154.

The etching protection layer ES is partially exposed at a location where the source electrode 173 and the drain electrode 175 are separated from each other. A passivation layer 180a is provided on a gate insulating layer 140 to cover the exposed portion of the etching protection layer ES, the source electrode 173, and the drain electrode 175. Except for the difference, the contents described with reference to FIG. 7 to FIG. 10 can be applied to the present exemplary embodiment.

Figure 14:
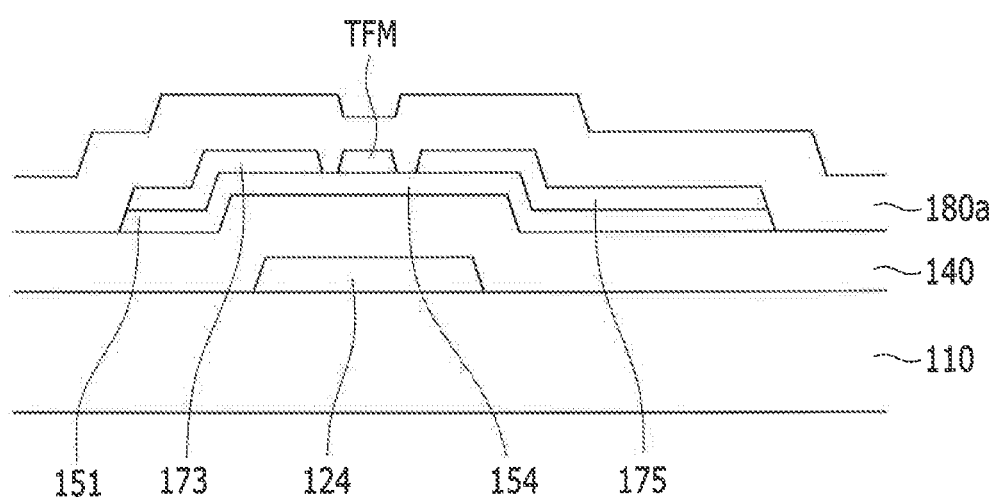
FIG. 14 is a cross-sectional view of a thin film transistor according to an exemplary embodiment of the present invention.

FIG. 14 is a cross-sectional view of a thin film transistor according to an exemplary embodiment of the present invention.

The exemplary embodiment of FIG. 14 is almost the same as the exemplary embodiment described with reference to FIG. 7 to FIG. 10. Therefore, only a different portion will now be described.

Referring to FIG. 14, a floating metal layer TFM is provided between a source electrode 173 and a drain electrode 175. The floating metal layer TFM has a constant distance from the source electrode 173 and the drain electrode 175, and in a plane view, the shape of the floating metal layer TFM may be a bar like the shape of the source electrode 173 or the drain electrode 175 or may have a "U" shape like the shape of the source electrode 173. The floating metal layer TFM may be made of the same material as the source electrode 173 and the drain electrode 175. A channel area is formed in the oxide semiconductor layer 154, and the floating metal layer TFM may be formed as an island at a location overlapping a channel area of the oxide semiconductor layer 154. in the present exemplary embodiment, the floating metal layer TFM is island-shaped and thus is electrically isolated, and accordingly, is electrically floated.

In the present exemplary embodiment, the floating metal layer TFM is made of the same material as the source electrode 173 and the drain electrode 175, but they may be made of different materials by performing respective patterning processes at different stages. Except for the difference, the contents described with reference to FIG. 7 to FIG. 10 can be applied to the present exemplary embodiment.

Figure 15:
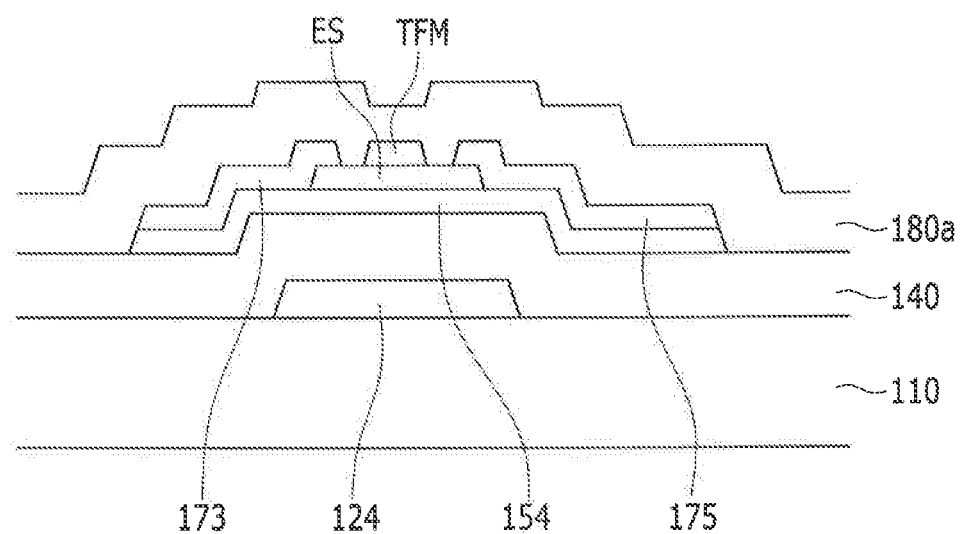
FIG. 15 is a cross-sectional view of a thin film transistor according to an exemplary embodiment of the present invention.

FIG. 15 is a cross-sectional view of a thin film transistor according to an exemplary embodiment of the present invention.

The exemplary embodiment of FIG. 15 is almost the same as the exemplary embodiment of FIG. 14. Therefore, only a different portion will now be described.

An etching protection layer ES is provided between an oxide semiconductor layer 154 and a first end of a source electrode 173, between the oxide semiconductor layer 154 and a floating metal layer TFM and between the oxide semiconductor layer 154 and a first end of a drain electrode 175. The etching protection layer ES may be made of a silicon-based oxide or a silicon-based nitride. The etching protection layer ES prevents permeation of a SiOx or moisture that may be generated during the next process into a channel area of the oxide semiconductor layer 154. The etching protection layer ES is formed to correspond to the channel area of the oxide semiconductor layer 154.

The first end of the source electrode 173 and the first end of the drain electrode 175 overlap an edge of the etching protection layer ES. The etching protection layer ES is partially exposed at a location where the source electrode 173 and the drain electrode 175 are separated from each other, and the floating metal layer TFM is formed in the exposed portion.

Such a structure of the present exemplary embodiment may be utilized as a dual gate structure. The dual gate structure is different from the present exemplary embodiment in mechanism in that the same voltage is applied to a top gate and a bottom gate to form a current flow in a back channel and a front channel. Unlike the dual gate structure, a thin film structure of the present exemplary embodiment can increase current without additionally applying a voltage, and reliability can also be improved.

Except for the difference, the content described with reference to FIG. 7 to FIG. 10 can be applied to the present exemplary embodiment.

Figure 16:
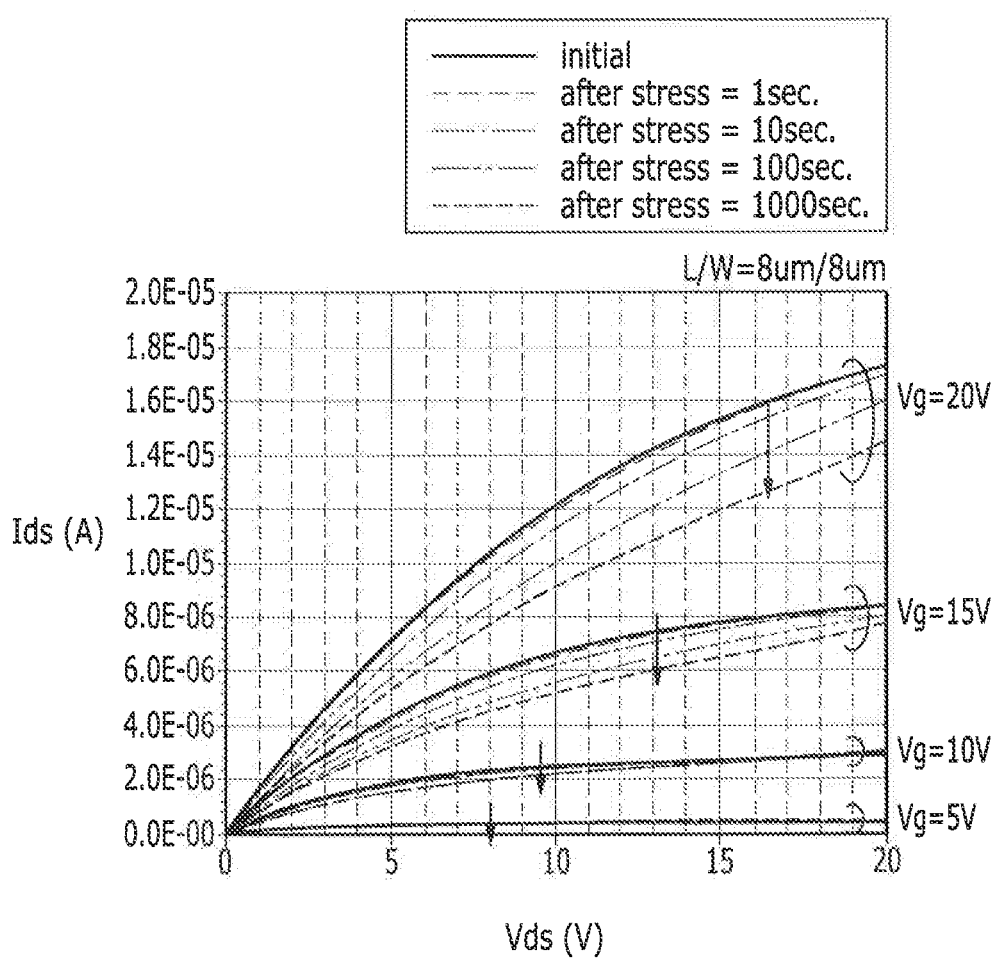
FIG. 16 is a graph illustrating a source-drain current according to a source-drain voltage in a comparative example.
Figure 17:
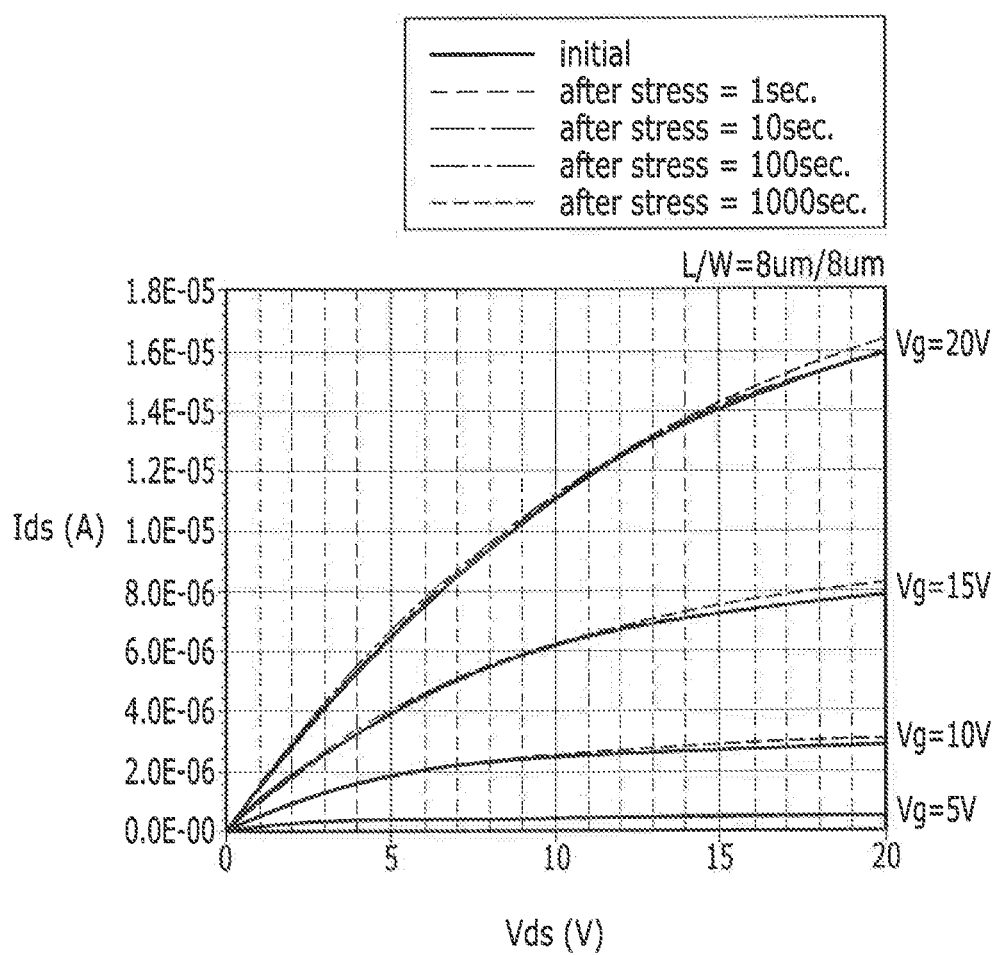
FIG. 17 is a graph illustrating a source-drain current according to a source-drain voltage in a thin film transistor according to an exemplary embodiment of the present invention.

FIG. 16 is a graph illustrating a source-drain current his according to a source-drain voltage Vds in a comparative example. FIG. 17 is a graph illustrating a source-drain current Ids according to a source-drain voltage Vds in a thin film transistor according to an exemplary embodiment of the present invention.

In the comparative example of FIG. 16, a thin film transistor of which the length of a channel area is 8 um and the width of the channel area is 8 um is manufactured, and a source-drain current variation measured while a DC voltage is applied as a stress factor to a source electrode and a drain electrode is maintained at 0 V. In this case, an off voltage is 0 V.

Referring to FIG. 16, it can be observed that the source-drain current Ids is gradually decreased as time elapses. As a threshold voltage Vg is increased, the source-drain current Ids is significantly decreased.

In the exemplary embodiment of FIG. 17, a thin film transistor of which the length and the width of a channel area are respectively 8 um is manufactured, and a source-drain current variation is measured while a DC voltage is applied as a stress factor to a source electrode and a drain electrode is maintained at 0 V. In this case, an off voltage is −5 V.

Referring to FIG. 17, limited or no variation occurs in the source-drain current Ids even though time passes. In other words, it can be observed that the source-drain current Ids is maintained, without regard to a threshold voltage Vg.

According to an exemplary embodiment of the present invention, an off signal input to a control terminal of a thin film transistor is maintained with a negative value while the thin film transistor is in a turn-off state. Thus, a channel area is cut-off during the turn-off state to prevent generation of accelerated electrons due to a leakage current, thereby improving reliability of the thin film transistor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor, comprising:
   a gate electrode;
   a source electrode;
   a drain electrode facing the source electrode;
   an oxide semiconductor layer disposed between the gate electrode and the source electrode and between the gate electrode and the drain electrode; and
   a gate insulating layer disposed between the gate electrode and the source electrode and between the gate electrode and the drain electrode,
   wherein the thin film transistor is included in a gate driver of a display device,
   wherein the source electrode is connected with a clock terminal of the gate driver and the drain electrode is directly connected with an output terminal of the gate driver, wherein the output terminal is connected with a gate line and outputs a gate signal, and
   wherein when a signal applied to the gate electrode is a turn-off signal and when a clock signal applied to the source electrode has a high level, a voltage applied to the gate electrode has a negative value.

2. The thin film transistor of claim 1, wherein the negative value is between about −20 V and about −3 V.

3. The thin film transistor of claim 2, wherein the oxide semiconductor layer includes indium gallium zinc oxide.

4. The thin film transistor of claim 1, wherein the oxide semiconductor layer is disposed on the gate electrode.

5. The thin film transistor of claim 1, wherein the gate electrode is disposed on the oxide semiconductor layer.

6. The thin film transistor of claim 1, further comprising an etching protection layer disposed on the oxide semiconductor layer and covering a channel area of the oxide semiconductor layer.

7. The thin film transistor of claim 1, wherein the gate electrode is wider than a channel area of the oxide semiconductor layer.

8. The thin film transistor of claim 7, wherein a thickness of the gate insulating layer is uniform in a portion of the gate insulating layer corresponding to the channel area.

9. The thin film transistor of claim 1, further comprising a floating metal layer disposed between the source electrode and the drain electrode.

10. The thin film transistor of claim 9, wherein the floating metal layer is electrically floated.

11. The thin film transistor of claim 10, wherein the floating metal layer overlaps a channel area of the oxide semiconductor layer.

12. The thin film transistor of claim 11, wherein the floating metal layer is disposed on a same layer as the source electrode and the drain electrode.

13. The thin film transistor of claim 12, wherein the floating metal layer has an island shape.

14. The thin film transistor of claim 13, further comprising an etching protection layer disposed between the floating metal layer and the oxide semiconductor layer.

15. The thin film transistor of claim 1, wherein a thickness of the gate insulating layer is uniform in a portion of the gate insulating layer corresponding to a channel area of the oxide semiconductor layer.

16. The thin film transistor of claim 15, wherein the negative value is between about −20V and about −3V.

17. The thin film transistor of claim 15, wherein the gate electrode is wider than the channel area of the oxide semiconductor layer.

18. The thin film transistor of claim 1, wherein when the gate electrode is applied with a negative voltage to turn off the thin film transistor, there is no conduction between the source electrode and the drain electrode.

* * * * *